May 30, 1967 C. S. COOKE 3,321,825

INTEGRATED CIRCUIT LEAD POSITIONER

Filed Nov. 10, 1966 2 Sheets-Sheet 1

INVENTOR.
CHARLES S. COOKE

BY Harry R. Lubcke
AGENT

May 30, 1967 C. S. COOKE 3,321,825

INTEGRATED CIRCUIT LEAD POSITIONER

Filed Nov. 10, 1966 2 Sheets-Sheet 2

INVENTOR.
CHARLES S. COOKE
BY Harry R. Lubcke
AGENT

United States Patent Office 3,321,825
Patented May 30, 1967

3,321,825

INTEGRATED CIRCUIT LEAD POSITIONER

Charles S. Cooke, Redwood City, Calif., assignor to Siliconix Incorporated, Sunnyvale, Calif., a corporation of California Filed Nov. 10, 1966, Ser. No. 593,467
10 Claims. (Cl. 29—203)

ABSTRACT OF THE DISCLOSURE

This multiple lead positioner employs a number of pointed "fingers" of intrinsically lubricated material, equal in number to the number of the leads. The fingers are converged upon the leads close to the case from which the leads emerge in one general direction. The case is independently held. The leads are caught in kite-shaped openings formed by adjacent lateral rabbet notches near the free ends of the fingers. The group of fingers are translated as a whole away from the case, thereby straightening and positioning the several leads in a prearranged pattern for insertion in a socket or the like.

Contra to this invention, the prior arts of incandescent lamps, vacuum tubes and transistors in manufacturing have required means to position only a relatively few leads so that these would be correctly spatially related to bases or sockets. Such positioning has characteristically been accomplished by elements engaging the leads from opposite sides.

While integrated circuits are often housed in the same type of cylindrical enclosing case as used for transistors, the number of leads involved has been significantly greater, such as twelve instead of three. For this reason, methods and means for positioning the leads of prior art devices have not been applicable to positioning the leads of integrated circuit devices.

According to this invention the same number of radially disposed "fingers" having shaped points are provided as there are leads to be positioned. The fingers are formed of an intrinsically lubricated material for suitably handling the leads and are provided with lateral rabbet notches so that kite-shaped openings position the leads between the fingers upon the fingers being radially converged to adjacency. This manipulation is accomplished near the junction of the leads and the case. The finger assembly is then manually translated away from the case upon an anti-friction ways structure until the fingers are located near the ends of the leads. In this process a certain amount of straightening of the leads takes place. Particularly, the leads are positioned so that they can be simultaneously inserted into a socket, a carrier for testing, a "standoff" for mounting upon printed circuit boards, or a machine for accomplishing further straightening of the leads or controlled bending of the same.

The drawing illustrates a preferred embodiment of the invention and therein:

Figure 1:
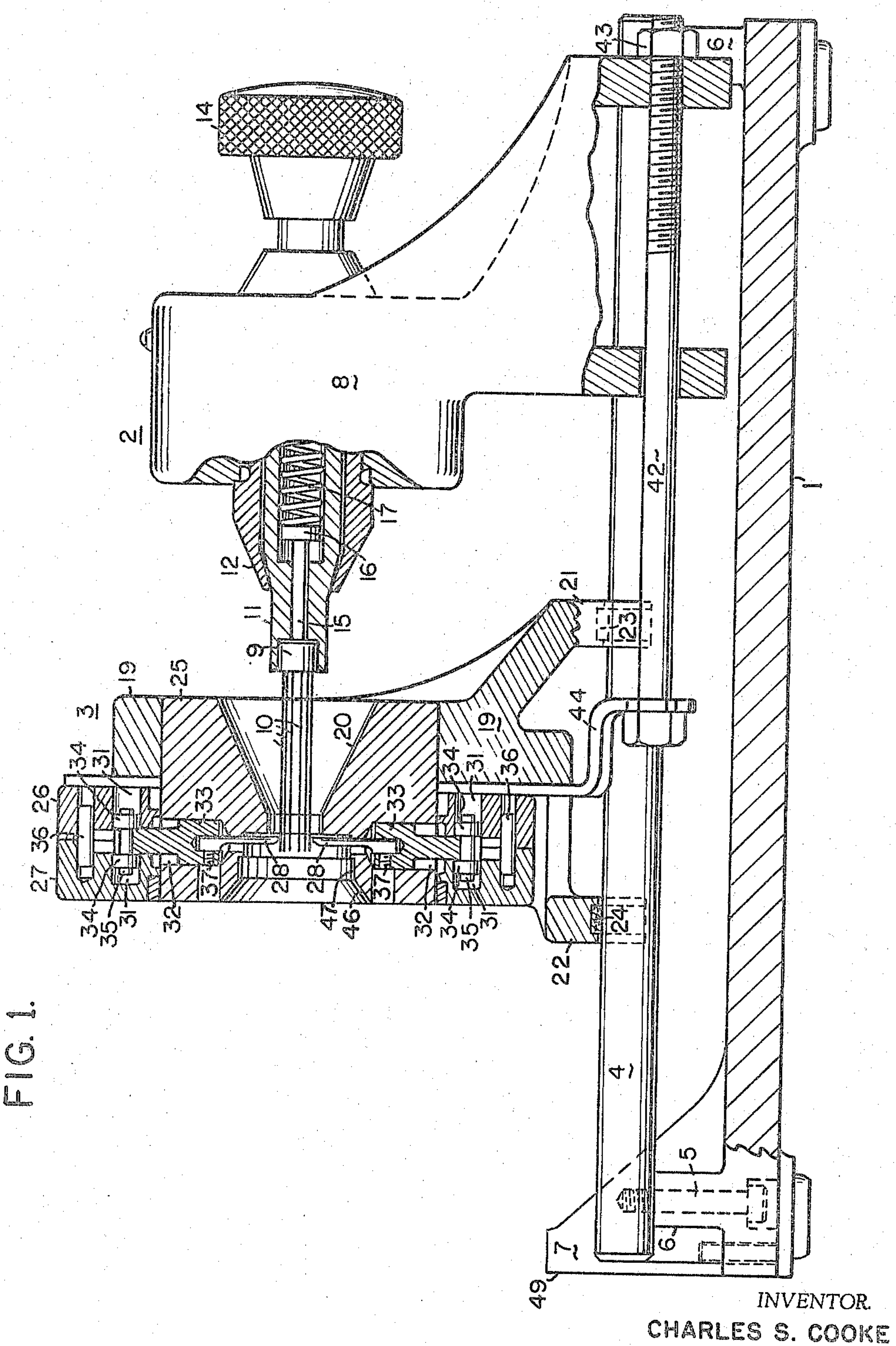
FIG. 1 shows a side elevation, partly in section, of the lead positioner.

In FIG. 1 numeral 1 indicates a base for the device, which base may be fabricated of cast iron or other rigid material. Two rods are spaced apart, one from the other, and above the base, upon which collet assembly 2 and finger assembly 3 may be translated. Only the rear rod 4 is seen in FIG. 1 because of the sectional nature of this figure. The rods are each attached to base 1 at left and right in FIG. 1, by cap screws 5 and narrow saddle supports 6. Shoulders 7 are provided at the forwar (left) end of the device to allow the same to be rigidly attached to other integrated circuit handling devices, such as a lead straightener. This latter device would be used to insure straight leads upon integrated circuit cases when the leads had been particularly badly bent in manufacturing or subjected to rough handling thereafter.

Collet assembly 2 is comprised of a main casting 8, which holds the collet elements per se and also provides a means of translating the same (left and right in FIG. 1) upon rods 4. A normally cylindrical case 9 encloses an integrated circuit or similar electrical entity. A plurality of leads 10, of which twelve leads is a typical number, are shown extending in the general direction to the left of the case. A collet element 11 has plural axial slits therein so that chuck 12 forces the collet to tightly grip case 9 upon knob 14 being rotated to translate collet 11 to the left in FIG. 1. This motion is accomplished by threaded means contained within main casting 8. Collet 11 is illustrated at substantially full size, to accept the known TO–5 semiconductor-enclosing case 9. A different sized collet may be substituted for other sized cases, such as the TO–18. A central cylindrical plunger 15, with piston head 16 and compression spring 17 acts as an ejector to case 9 when collet 11 is opened upon the completion of a positioning and inserting operation.

Finger assembly 3, which is supported by casting 19, has a relatively large conical hole 20 in its body 25, which hole is centrally disposed with respect to leads 10 of case 9, and ways 21 and 22 that slide upon rods 4.

It has been found that a particular degree of friction and particularly a reduction of static (break-free) friction is desirable in the normally manual movement of the finger assembly 3. Accordingly, inserts 23 and 24 are provided upon the inner concave surfaces of ways 21 and 22, respectively. "Rulon T tape" is a self-lubricating solid and has been found satisfactory for these inserts. Leather or a porous bronze bushing are alternate materials. Each of ways 21 and 22 have an inverted U shape. The bottom is open. Finger assembly 3 can thus be translated over supports 6 of rods 4.

Rear rotative collar 26 and forward rotative collar 27 are rotatively disposed about the outer circumference of body 25, so that the plurality of fingers 28 can be radially converged or diverged as required in the lead-positioning process. It will be noted in FIGS. 1 and 2 that a plurality of oblique slots 31 are provided in both collars. Strictly radial holes 32 are provided in the forward (left) part of body 25, in which holes cam followers 33 radially reciprocate. Each follower carries a rigidly attached finger 28 within an axial bore and clamped by a set screw 37. Each cam follower is actuated by a pair of cam rollers 34; one of each pair running in the oblique slot 31 in rear rotative collar 26 and the other in the oblique slot 31 in front rotative collar 27. A common dowel shaft 35 couples each pair of rollers to its cam follower 33. A suitable material for the cam rollers is Nylatron G.S. or brass. The front and rear rotative collars are accurately indexed by dowel pins 36 and are fastened together by flat head screws 30, which are seen in FIG. 2.

Figures 2, 3, 4:
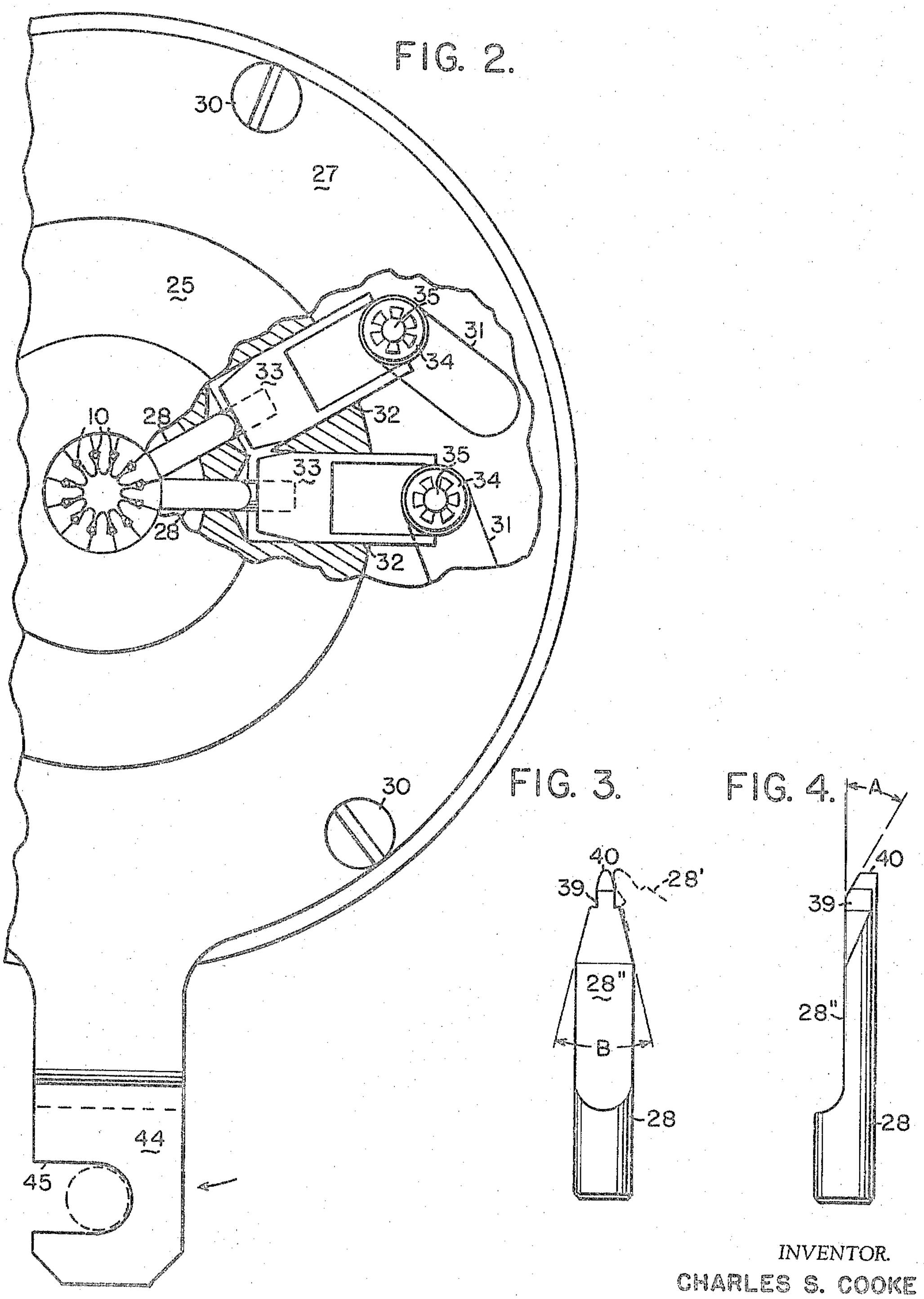
FIG. 2 shows half of a front elevation, partly in section and on an enlarged scale, of the lead positioner; particularly the finger-containing body and collar portions.
FIG. 3 shows a further enlarged plan view of a single finger.
FIG. 4 shows an also further enlarged side elevation of a single finger.

In FIG. 1 fingers 28 are shown radially retracted (diverged), while in FIG. 2 these are shown extended (converged). In FIG. 1 the plurality of leads 10 are not in significant contact with the fingers 28, but in FIG. 2 each of the leads is held between two adjacent fingers in double-triangular "kite-shaped" openings. This is shown in greater detail in FIGS. 3 and 4. FIG. 1 is essentially full size of a representative embodiment, FIG. 2 is double size, and FIGS. 3 and 4 are four times full size. Each rabbet 39 in a finger 28 in FIG. 3 coacts with the rabbet in an adjacent finger, as the one shown dotted as 28', to form the kite-shaped opening.

It has been found that the shape of the ends of the fingers and the material of which they are made determines whether the lead positioner of this invention will perform excellently or hardly at all. This concerns the presence of rabbet notch 39 and the restricted axial length (in the direction of leads 10) of each finger; namely, that accomplished by the chamfering according to angle A in FIG. 4. This angle may have a value of the order of thirty degrees. The axial length of the tip remaining, 40, is then about half of the axial length of the finger farther away from the tip. The tip is rounded, as by a curve with a 0.006 inch radius. The diameter of each finger 28, as at the bottom of FIGS. 3 or 4, is typically ⅛". A flat portion 28" is typically such that a half-round cross-section is obtained. Typically, wedge point 40 has a radius of curvature of the same order as the radius of the lead 10 to be positioned, and the axial length of the wedge point, as shown in FIG. 4, is of the order of two times the diameter of lead 10.

For the finger material a moly-disulphide-filled plastic, which plastic may be nylon, is preferred. This is commercially obtainable under the trademark Nylatron G.S. This material displays needed characteristics of strength and self-lubrication. The first characteristic insures that fingers 28 will be long-lasting in service and the second characteristic insures that leads 10 will be gently handled.

Leads 10 are normally fabricated of the known Kovar wire, which is gold plated for good contact properties and freedom from corrosion. The gold plating should not be scratched, otherwise the base metal beneath would be exposed. The self-lubricating characteristic of the material proposed properly handles leads 10.

Another material, Delrin, filled with moly-disulphide, may also be used. However, this material does not have the toughness of Nylatron and so requires that the fingers be replaced more often. A third material is Teflon. This is self-lubricated, but it is too soft for satisfactory life of the fingers under commercial use conditions.

An adjustable stop 42 is provided betwen collet assembly 2 and finger assembly 3. This takes the form of a relatively long bolt. It is threaded into the rear (right-hand in FIG. 1) lower lug of casting 8 and is provided with locknut 43. A downwardly extending arm 44 is a part of finger assembly 3, which arm is provided with a slot 45, so located as to engage the shank of (bolt) stop 42 when arm 44 is oriented circumferentially to so do. This is preferably when all of the fingers 28 are converged to hold the leads 10. Then separation of the collet and finger assemblies cannot be too far, such as to exceed the length of the leads 10 and thereby frustrate the lead positioning function. The fingers are converged by rotation of the rear and front rotative collars 26 and 27. By attaching arm 44 to the rear rotative collar it is effective in limiting the separation of the two assemblies when the fingers are converged. When the reverse is true the different circumferential position of the rear rotative collar and slot 45 in the arm positions the latter free of stop (bolt) 42 and the two assemblies can be separated as far as desired. Of course, arm 44 can be attached to non-rotative body 25 and thereby always be effective.

In operating this lead positioner, knob 14 is turned counter-clockwise about a half turn to open collet 11. Case 9 is inserted in the collet with leads 10 extending to the left as seen in FIG. 1. Knob 14 is then turned clockwise a half turn to close collet 11 and firmly grip case 9. In the general circumstance, leads 10 will be twisted and bent to some degree from prior handling in manufacturing.

Fingers 28 are retracted (the "iris" they form is opened) to the position shown in FIG. 1. This is accomplished by rotating rotative collars 26 and 27 (these are fastened together and rotate as a unit) by grasping the same with the hand, or by grasping a radially extending handle which is preferably provided facing outward from the paper in the drawing, but which is not shown in either of FIG. 1 or 2 because of the sectional nature of these figures. Typically, the amount of rotation is 30° or less. Note the circumferential length of slots 31 in FIG. 2, which determines this amount.

Next, assemblies 2 and 3 are brought together. In FIG. 1 these have been shown in what is normally the farthest apart position. Since both assemblies translate on rods 4, either or both assemblies may be moved. When the two assemblies are substantially in contact, as is arranged by translating until way 21 is touching casting 8, fingers 28 are then in a plane quite close to case 9. The fingers are then converged to the position shown in FIG. 2. Since it is unlikely that any leads 10 would be so severely bent as to be appreciably out of position close to their entrance into case 9, there is no problem of automatically guiding the plurality of leads 10 into the kite-shaped openings that are formed between adjacent fingers when these are converged.

Next, the two assemblies are moved apart, as by moving the finger assembly 3 to the left in FIG. 1 to the position shown in that figure. Stop (bolt) 42 has previously been adjusted in effective length to terminate the separation before leads 10 pass out of control of fingers 28. Thus, the leads are accurately positioned, one from the other, and are easily simultaneously inserted in a socket, carrier, standoff, or for straightening in an additional machine for such purpose. The radial tab provided in standard TO cases is nested in a slot in collet 11 (slot not shown) so that the positioning of each of the leads 10 is the same for each operation. In this way the integrated circuit leads are "loaded" into a fitment and the purpose of the apparatus of this invention is accomplished.

The socket or other fitment is normally manually brought to the leads from the left toward the right of finger assembly 3 in FIG. 1, passing within the conical coaxial opening 46 and the adjacent cylindrical opening 47. The configuration of FIG. 1 shows the fingers retracted and at the extreme position with respect to useful positioning and the length of leads 10, such as occurs in the use of the positioner just after the leads had been loaded into a socket and preparation was being made to expel case 9 from collet 11. Such expulsion is accomplished by turning knob 14 counterclockwise, at which time ejection assembly 15, 16, 17 pushes case 9 out of the collet, since the restraining force of the collet has been removed. The positioner is then essentially in condition for receiving the next case for processing the leads thereof. It has been found in practice that some 350 loadings per hour can be accomplished.

When the assemblies 2 and 3 are moved apart, as recounted above, a reasonable straightening action occurs upon leads 10. This is sufficient for leads which are loaded to be later clipped off after soldering, for example, or for a case 9 in which the leads have been only moderately deflected from mutual axial parallelism, say in amount of 20°. For thorough straightening a multiple die orbital straightener, or the equivalent, can be attached to the left face 49 of base 1. Both assemblies 2 and 3 are translated to the left in FIG. 1, preferably by applying manual force upon assembly 3, and the leads 10 are caused to enter the straightener by force subsequently applied to assembly 2. After straightening, assembly 2 is re-translated to the right and the integrated circuit either loaded into a fitment as has been described, or withdrawn from the positioner apparatus for packaging and sale.

In the alternate embodiments possible with respect to case 9 and lead configurations, the working characteristics of fingers 28 may be frabricated according to the following table:

| Configuration | Angle "B," degrees | Width of Tip 40, inch | Length of Rabbet 39, inch |
|---|---|---|---|
| 12 lead TO-5 | 30 | 0.030 | 0.052 |
| 3, 4, 6 and 8 lead TO-5 | 45 | 0.054 | 0.038 |
| 10 lead TO-5 | 36 | 0.040 | 0.045 |
| 14 lead TO-5 | 25 | 0.021 | 0.061 |
| 3, 4 lead TO-18 | 90 | 0.049 | 0.022 |
| 6 lead TO-18 | 60 | 0.032 | 0.025 |
| 8 lead TO-18 | 45 | 0.020 | 0.032 |
| 8 lead TO-47 | 45 | 0.032 | 0.038 |

Although this invention has been described in a preferred form with a certain degree of particularity, this has been only by way of example. Various changes in the details of construction may be made without departing from the spirit and scope of the invention as hereinafter claimed.

Having thus fully described the invention and the manner in which it is to be practiced, I claim:

1. In a device for handling components having a case and a plurality of leads extending in one general direction therefrom,
said device having means for holding said case;
lead positioning means comprising:
(a) the same plurality of fingers as the plurality of said leads,
(b) means to circumferentially position said fingers according to the configuration into which said leads are to be positioned,
(c) means to radially converge said fingers into adjacent later contact,
to position said leads individually laterally therebetween,
(d) a wedge point formed upon each side of each of said fingers to allow said convergence,
(e) a slanting surface on the tip of each of said fingers to reduce the length of the wedge point thereof, and
(f) a lubricant intrinsic with each finger to allow each said lead to slide relative to each said finger during relative motion between the two during said positioning.

2. The device of claim 1 which additionally includes;
(a) a rabbet notch formed upon each lateral face of each said wedge point,
(b) whereby a substantially kite-shaped opening is formed between each pair of said fingers when said fingers are brought into lateral contact by radial convergence, and
(c) the number and positions of said openings substantially matches the number and positions of said plurality of said leads at the junctions thereof with the case of said component.

3. The device of claim 1 which additionally includes;
(a) means to move radially converged said plurality of fingers away from said case as a group,
thereby to comb outwardly said plural leads, and to position the ends of said plural leads in the same relative position as occupied by said leads adjacent to said case.

4. The device of claim 3 which additionally includes;
(a) an anti-friction insert within said means to move said plurality of fingers from said case which bears upon the stationary part of said device,
to permit smooth manual movement of said means to move said plurality of fingers.

5. The device of claim 3 which additionally includes;
(a) a stop attached to said means for holding said case,
(b) an arm attached to said means to radially converge said fingers,
such that upon said fingers being converged said arm engages said stop at the end of the movement of said fingers away from said case as a group,
whereby said plurality of leads are held by said fingers at approximately the ends of said leads.

6. The device of claim 5 which additionally includes;
(a) longitudinally adjustable means upon said stop, whereby the position of said stop with respect to said means for holding said case may be adjusted.

7. The device of claim 1 in which;
(a) said intrinsic lubricant is comprised of moly-disulphide within a finger of nylon.

8. The device of claim 1 in which;
(a) said wedge point on each said finger has a radius of the same order as the radius of a said lead of said plurality, and
(b) the length of said wedge point on each said finger is of the order of two times the diameter of a said lead of said plurality.

9. The device of claim 1 in which;
(a) said fingers are positioned substantially uniformly circumferentially,
whereby said leads are constrained in substantially a circular configuration during all of the manipulation of said leads by said fingers.

10. The device of claim 1 in which said means to radially converge said fingers includes;
(a) plural rotative collars having plural pairs of slots oblique to radii thereof,
(b) plural pairs of rollers rotatively disposed within said slots, and
(c) one follower attached to each of said pair of rollers and to a said finger for simultaneous radial movement of said plurality of fingers.

References Cited

UNITED STATES PATENTS

| | | | |
|---|---|---|---|
| 1,117,059 | 11/1914 | Kremenezky | 29—25.2 |
| 2,390,139 | 12/1945 | Vasseli | 29—25.13 |
| 3,114,199 | 12/1963 | Flodberg | 29—203 |

WILLIAM I. BROOKS, *Primary Examiner.*